United States Patent [19]
Rubinstein

[11] 3,956,640
[45] May 11, 1976

[54] BUFFER AMPLIFIER FOR RIPPLE-CARRY BINARY GENERATOR

[75] Inventor: Richard B. Rubinstein, North Bergen, N.J.

[73] Assignee: General Instrument Corporation, Clifton, N.J.

[22] Filed: Sept. 22, 1974

[21] Appl. No.: 508,080

[52] U.S. Cl............................. 307/205; 307/DIG. 1
[51] Int. Cl.² ........................................ H03K 19/08
[58] Field of Search........... 330/35; 307/205, 221 C, 307/251, 304, DIG. 1

[56] References Cited
UNITED STATES PATENTS

| | | | |
|---|---|---|---|
| 3,480,796 | 11/1969 | Polkinghorn et al. | 307/304 X |
| 3,728,556 | 4/1973 | Arnell | 307/251 |

Primary Examiner—James B. Mullins
Attorney, Agent, or Firm—Roland Plottel

[57] ABSTRACT

A buffer amplifier for use with a ripple-carry binary generator comprises a pair of serially connected FET transistors. The input to one of the transistors is pre-charged by the preceding generator stage and also receives the ripple carry signal. A feedback loop from the output of the transistor to the input hastens the transition from the pre-charge condition to ground.

3 Claims, 5 Drawing Figures

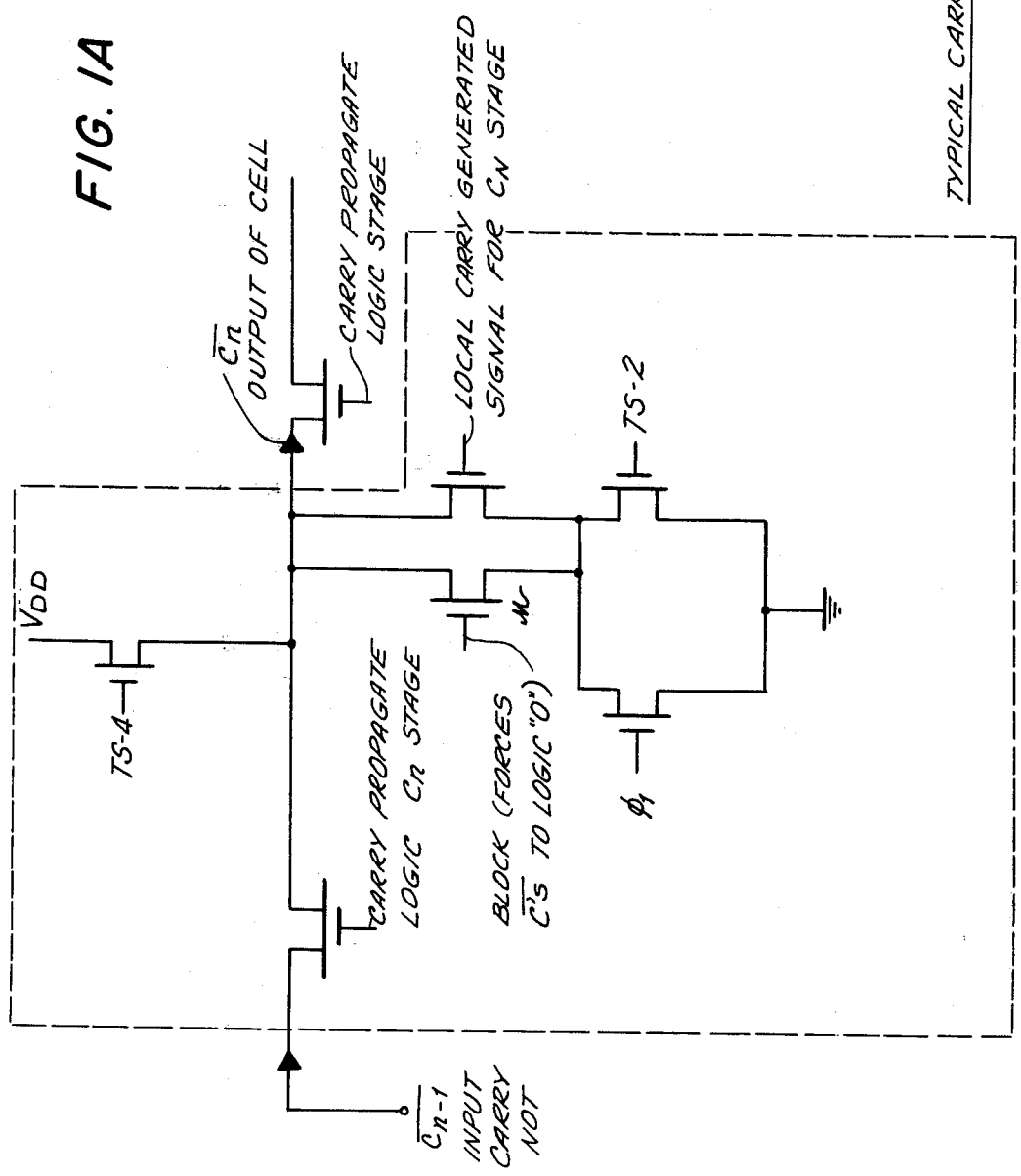

BUFFER AMPLIFIER FOR RIPPLE-CARRY BINARY GENERATOR

BACKGROUND OF THE INVENTION

1. Field of The Invention

Broadly speaking, this invention relates to buffer amplifiers. More particularly, in a preferred embodiment, this invention relates to a buffer amplifier for use with ripple-carry generators of the type that employ multi-phase logic.

2. Discussion of the Prior Art

As is well known, a ripple-carry generator comprises a plurality of cascaded stages, the output of each stage being connected to the input of the next. Typically each stage of the generator includes a multi-phase logic circuit having several FET transistors and an MOS output transistor.

Unfortunately, because of the fact that a ripple-carry generator comprises many cascaded stages, the capacitance that must be driven by the output MOS device in a given stage is the total string capacitance of all the remaining stages in the generator together with any interconnect capacitance which is in series with it. This unwanted capacitance tends to slow the operation of the ripple-carry generator and is, hence, undesirable.

One way to eliminate this undesired capacitance would be to increase the physical size of the devices in each stage, but to be effective this increase would have to be substantial and the increased demand for silicon area would make it impossible to fabricate the generator using integrated circuit techniques.

SUMMARY OF THE INVENTION

I have discovered that the problem of eliminating unwanted capacitance while retaining high-speed operation and integrated circuit configuration can be solved by including a buffer amplifier between one or more stages of the ripple-carry generator.

In a preferred embodiment, this buffer amplifier comprises first and second field-effect transistors serially connected between an external supply source and ground; means, connected to the gate electrode of said first transistor, for supplying a train of clock pulses of a first phase from an external clock pulse generator; means, connected to the gate electrode of said second transistor, for pre-charging said gate electrode in a positive-direction during a first time slot synchronized with said clock pulses of a first phase and for subsequently supplying a negative-going input pulse thereto during a second time slot synchronized with said clock pulses; a third field-effect transistor connected between the gate electrode of said second transistor and ground; a feedback circuit connected between the juncture of the drain electrode of said second transistor and the source electrode of said first transistor and the gate electrode of said third transistor; fourth and fifth field-effect transistors serially connected between said supply source and ground, the gate electrode of said fifth transistor being connected to the juncture between said first and second transistors, the output of said amplifier being taken from the drain electrode of said fifth transistor; and means, connected to the gate electrode of said fourth transistor, for supplying a pulse train to said fourth transistor during said first time slot.

The invention and its mode of operation will be more fully understood from the following detailed description when taken with the drawings in which:

DESCRIPTION OF THE DRAWINGS

FIG. 1a is a schematic drawing showing a typical propagation stage;

DETAILED DESCRIPTION OF THE INVENTION

Figure 1:
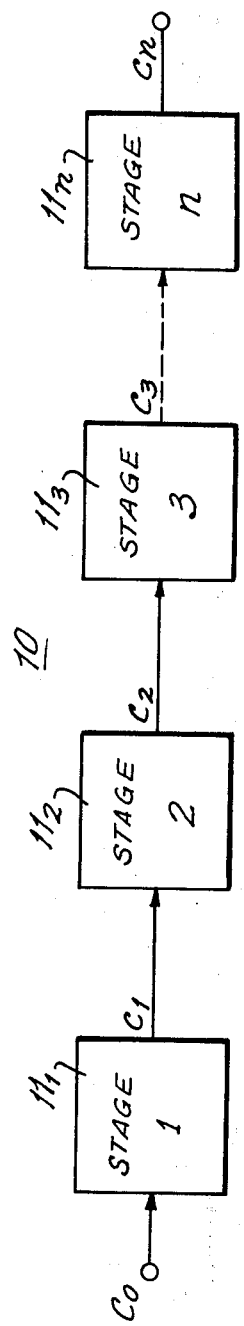
FIG. 1 is a simplified block diagram of a typical prior-art ripple-carry generator.

FIG. 1 depicts a typical, prior art, $n$-stage, ripple-carry generator 10 comprising a plurality of cascaded stages $11_1 - 11_n$. As previously discussed, the output transistor in stage 2, for example, "sees" a capacitance, Cx, across its output which comprises the capacitance of stage $11_4$ . . . plus the capacitance of stage $n$, together with any stray interconnect capacitance that may exist. This capacitance Cx will slow down the operation of stage 2 and hence the overall ripple-through of the generator. All other stages of the generator see a similar, but different value, capacitance.

Figure 2:
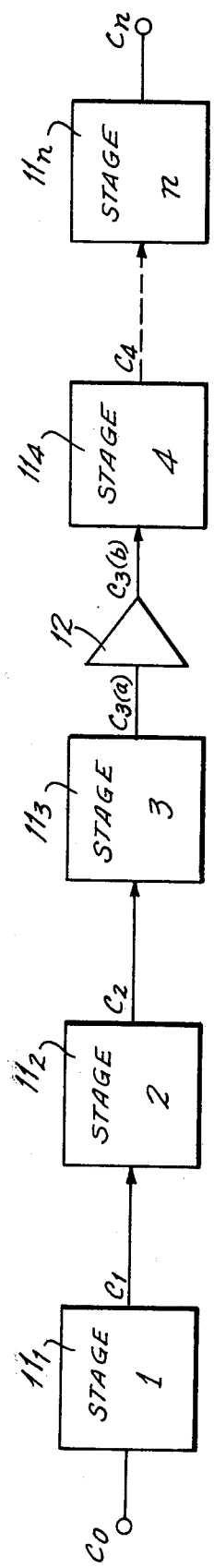
FIG. 2 depicts the generator of FIG. 1 as modified by the inclusion of a buffer-amplifier according to this invention.

As shown in FIG. 2, if a buffer-amplifier 12 according to the invention is inserted, for example, between stages $11_3$ and $11_4$, the capacitance "seen" by the output transistor of stage $11_3$ is drastically reduced and the speed at which ripple-through occurs is greatly enhanced. Although only one buffer-amplifier is shown, one skilled in the art will appreciate that $(n-1)$ such buffer-amplifiers, or any lesser number, may be interspersed between the n stages of the generator.

Figure 3:
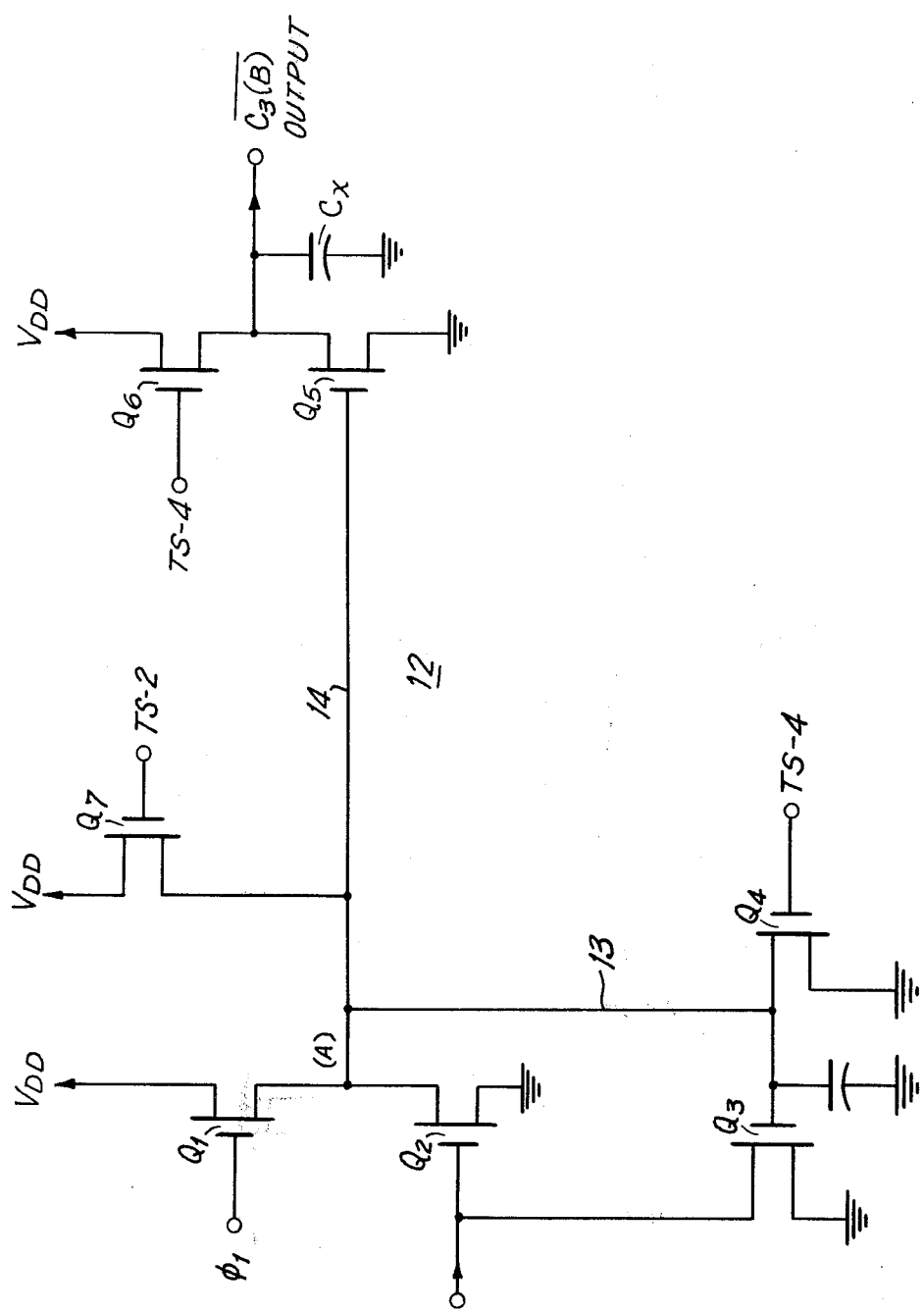
FIG. 3 is a detailed schematic drawing of the buffer-amplifier shown in FIG. 2.
Figure 4:
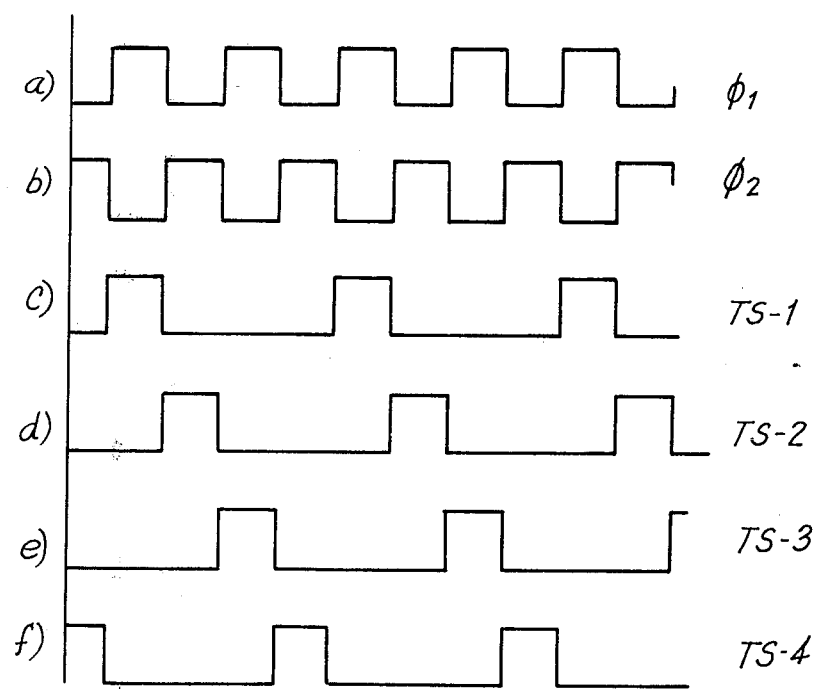
FIG. 4 is a timing diagram useful in understanding the operation of the buffer-amplifier shown in FIG. 3.

Turning now to FIG. 3, and to FIG. 4 which is a timing diagram illustrating how timing pulses TS-1 through TS-4 are derived from the two phases $\phi_1$ and $\phi_2$ of a clock-pulse generator (not shown), the amplifier 12 comprises the series connection of a pair of FET transistors $Q_1$ and $Q_2$ between a supply potential VDD and ground. The gate of $Q_1$ is connected to phase $\phi_1$ of the clock circuit (not shown) while the gate of transistor $Q_2$ is connected to the output [$C_3(a)$] of the previous stage $11_3$. Circuitry associated with stage $11_3$ of the ripple-carry generator 10 (and not shown in FIG. 3) pre-charges the gate of transistor $Q_2$ during time slot TS-4. Then, if a negative-going pulse is applied to the gate of transistor $Q_2$ from stage $11_3$, the voltage at Node "A" will become more positive due to the fact that $Q_2$ cuts-off. Node "A" is connected, via a conductor 13, to the gate of transistor $Q_3$ and the drain electrode of transistor $Q_4$, the gate of which receives a positive pulse during time-slot TS-4. As soon as the potential at Node "A" reaches the threshold potential of transistor $Q_3$, $Q_3$ will conduct further increasing the rate at which the gate of transistor $Q_2$ is dropping to ground.

Transistor $Q_4$ is provided to pre-charge the gate of transistor $Q_3$ back to ground in the event that the ripple-through passing through buffer 12 leaves the gate of transistor $Q_3$ at some positive potential. This pre-charge to ground occurs during TS-4, just prior to the next incoming ripple-through from stage $11_3$. If transistor $Q_4$ were not provided, there is a strong probability that transistor $Q_3$, once gated "on", would remain "on", permanently grounding the base of transistor $Q_2$ and making it impossible for generator stage $11_2$ to pre-charge the base of transistor $Q_2$ positive, just prior to the next negative going ripple-through signal.

Node "A" is connected, via a lead 14, to the gate of transistor $Q_5$ which is serially connected with transistor $Q_6$ between the supply potential VDD and ground. The output of buffer-amplifier 12 is taken from the drain electrode of transistor $Q_5$ and Cx, which represents the unwanted stray capacitance the circuit is intended to isolate, is shown as being connected across the output of transistor $Q_5$.

A transistor $Q_7$ is connected between supply VDD and line 14.

Thus, when transistor $Q_6$ is gated into conduction during time-slot TS-4, the subsequent change in the potential of Node "A" rapidly appears on the drain electrode of transistor $Q_5$. The stray capacitance, Cx, having been priorly charged when transistor $Q_6$ is caused to conduct (during time-slot TS-4), has practically no effect on the transition occurring at the output of transistor $Q_5$. Thus, the transition at the input to transistor $Q_2$ appears at the output of transistor $Q_5$ almost instantaneously and the stray capacitance Cx is effectively isolated from the output of stage $11_2$.

In an experimental embodiment actually built and tested in an 8-bit Arithmetic Logic Unit associated with the Central Processing Unit of a general purpose digital computer, the buffer amplifier introduced a ripple-carry propagation delay of only 130-nano-seconds.

One skilled in the art may make various changes and substitutions to the arrangement of parts shown without departing from the spirit and scope of the invention.

What I claim is:

1. A buffer-amplifier which comprises:
   first ($Q_1$) and second ($Q_2$) field-effect transistors serially connected between an external supply source (VDD) and ground;
   means, connected to the gate electrode of said first transistor ($Q_1$), for supplying a train of clock pulses of a first phase ($\phi_1$) from an external clock pulse generator;
   means, connected to the gate electrode of said second transistor ($Q_2$), for pre-charging said gate electrode in a positive-direction during a first time slot (TS-4) synchronized with said clock pulses of a first phase ($\phi_1$) and for subsequently supplying a negative-going input pulse thereto during a second time slot (TS-1) synchronized with said clock pulses ($\phi_1$);
   a third field-effect transistor ($Q_3$) connected between the gate electrode of said second transistor and ground;
   a feedback circuit (13) connected between the juncture of the drain electrode of said second transistor and the source electrode of said first transistor and the gate electrode of said third transistor ($Q_3$);
   fourth ($Q_6$) and fifth ($Q_5$) field-effect transistors serially connected between said supply source (VDD) and ground, the gate electrode of said fifth transistor being connected to the juncture between said first and second transistors, the output of said amplifier being taken from the drain electrode of said fifth transistor ($Q_5$); and
   means, connected to the gate electrode of said fourth transistor ($Q_6$), for supplying a pulse train to said fourth transistor during said first time slot (TS-4).

2. The amplifier according to claim 1 further comprising:
   a sixth field-effect transistor ($Q_4$) connected between the gate electrode of said third transistor ($Q_3$) and ground; and
   means, connected to the gate electrode of said sixth transistor ($Q_4$), for supplying a train of pulses to said sixth transistor during said first time-slot (TS-4).

3. The amplifier according to claim 2 further comprising:
   a seventh field-effect transistor ($Q_7$) connected between the gate electrode of said fifth transistor ($Q_5$) and said supply (VDD); and
   means, connected to the gate electrode of said seventh transistor ($Q_7$), for supplying a pulse train to said seventh transistor during a third time slot (TS-2).

* * * * *